(12) United States Patent
Park et al.

(10) Patent No.: US 12,550,435 B2
(45) Date of Patent: Feb. 10, 2026

(54) ANISOTROPIC CONDUCTIVE FILM INCLUDING LIQUID METAL, METHOD FOR MANUFACTURING THE SAME AND DISPLAY DEVICE USING THE SAME

(71) Applicants: LG Display Co., Ltd., Seoul (KR); Yonsei University Industry-Academic Cooperation Foundation, Seoul (KR)

(72) Inventors: Jang-Ung Park, Seoul (KR); Harkjin Kim, Paju-si (KR); Kwanghwan Ji, Paju-si (KR); Hyobeom Kim, Seoul (KR); Younggeun Park, Seoul (KR)

(73) Assignees: LG Display Co., Ltd., Seoul (KR); YONSEI UNIVERSITY INDUSTRY-ACADEMIC COOPERATION FOUNDATION, Seoul (KR)

( * ) Notice: Subject to any disclaimer, the term of this patent is extended or adjusted under 35 U.S.C. 154(b) by 289 days.

(21) Appl. No.: 17/743,309

(22) Filed: May 12, 2022

(65) Prior Publication Data

US 2022/0367524 A1    Nov. 17, 2022

(30) Foreign Application Priority Data

May 13, 2021    (KR) .................. 10-2021-0062237

(51) Int. Cl.
| | |
|---|---|
| *H10D 86/60* | (2025.01) |
| *C09J 9/02* | (2006.01) |
| *C09J 189/04* | (2006.01) |
| *G09F 9/30* | (2006.01) |
| *H01B 1/22* | (2006.01) |
| *H01B 5/14* | (2006.01) |
| *H10D 86/40* | (2025.01) |

(52) U.S. Cl.
CPC ............... *H10D 86/60* (2025.01); *C09J 9/02* (2013.01); *C09J 189/04* (2013.01); *G09F 9/301* (2013.01); *H01B 1/22* (2013.01); *H01B 5/14* (2013.01); *H10D 86/441* (2025.01); *C09J 2301/314* (2020.08); *C09J 2301/408* (2020.08)

(58) Field of Classification Search
CPC ..................................................... H01L 27/124
See application file for complete search history.

(56) References Cited

U.S. PATENT DOCUMENTS

| | | | |
|---|---|---|---|
| 6,833,900 B2 * | 12/2004 | Aruga | .................... G02F 1/1345 349/149 |
| 2002/0135293 A1 | 9/2002 | Aruga | |
| 2007/0278448 A1 * | 12/2007 | Chari | .................. C09K 19/0225 252/299.01 |

(Continued)

FOREIGN PATENT DOCUMENTS

| | | |
|---|---|---|
| JP | 2003152017 A | 5/2003 |
| JP | 2016051810 A | 4/2016 |
| KR | 2017-0025996 A | 3/2017 |

*Primary Examiner* — William D Young
(74) *Attorney, Agent, or Firm* — Seed Intellectual Property Law Group LLP

(57) ABSTRACT

The present disclosure relates to an anisotropic conductive film capable of electrode bonding even at a low temperature and maintaining excellent conductivity and flexibility, a manufacturing method thereof, and a display device using the same. The anisotropic conductive film contains conductive microcapsules including a liquid metal in a binder layer.

11 Claims, 7 Drawing Sheets

(56) References Cited

U.S. PATENT DOCUMENTS

2017/0062374 A1\* 3/2017 Chu .................. H01L 24/09
2018/0350701 A1\* 12/2018 Kim .................. H10D 86/60
2018/0352654 A1\* 12/2018 Fassler ............... H05K 3/323
2020/0369842 A1\* 11/2020 Agarwal ............. C08G 59/245
2021/0355257 A1\* 11/2021 Daigle ............... H01M 4/386

\* cited by examiner

ANISOTROPIC CONDUCTIVE FILM INCLUDING LIQUID METAL, METHOD FOR MANUFACTURING THE SAME AND DISPLAY DEVICE USING THE SAME

CROSS-REFERENCE TO RELATED APPLICATION

The present application claims priority to Republic of Korea Patent Application No. 10-2021-0062237, filed May 13, 2021, of which is incorporated by reference in its entirety.

BACKGROUND

Technical Field

The present disclosure relates to an anisotropic conductive film including a liquid metal, a method for manufacturing the same, and a display device using the same.

Description of the Related Art

Recently, as demand for thin and flexible electronic devices increases, a technology for making a printed circuit board (PCB) more flexible is becoming more important.

A conventional wiring process on the PCB representatively includes soldering, an anisotropic conductive film (ACF) method, and an anisotropic conductive paste (ACP) method.

Among the above methods, the soldering is a wiring connection process technology in which a small diameter metallic object is placed between a pad and a main chip pad on a printed circuit board and heat is applied to connect the two pads. Compared to wire bonding that bonds thin metallic wires to a pad, the soldering has advantages in that it has a higher joint reliability, is capable of transmitting electrical signals, and can be mass-produced at a low cost.

The anisotropic conductive film (ACP) and the anisotropic conductive paste (ACF) are composed of a conductive metal and an adhesive material. When the anisotropic conductive paste (ACF) is coated between the pads on the PCB and the pads of other electronic devices and cured by applying heat and pressure, anisotropic conductive properties are created and electrical connection can be made between circuits.

PRIOR ART DOCUMENT

Patent Document

Korean Laid-Open Patent Application No. 10-2003-0004741 (Jan. 15, 2003)

BRIEF SUMMARY

The inventors, by their study and investigation, realized that when a non-stretchable material (gold, copper, aluminum, etc.) is used for the soldering and conductive paste has a limitation in that it is difficult to manufacture such that it is flexible because the non-stretchable material is vulnerable to mechanical deformation due to its low stretchability. Also, since the bonding process is performed at a high temperature (100° C. to 400° C.) which does not allow the bonding process to be performed at room temperature, the soldering and conductive paste are difficult to apply to a flexible printed circuit board having a large thermal expansion coefficient. In addition, there is also a disadvantage that the soldering and conductive paste cannot be used for an electrode with a fine spacing (<50 um).

Therefore, in order to better implement a flexible circuit, the inventors realized that it is desired to have a wiring bonding technology that can be implemented at a low temperature while maintaining high conductivity and flexibility. Accordingly, they have come up with various solutions to implement the solutions they recognized were desired by the industry.

An object of the present disclosure is to provide an anisotropic conductive film capable of electrode bonding even at a low temperature and maintaining excellent conductivity and flexibility, a manufacturing method thereof, and a display device using the same.

One embodiment is an anisotropic conductive film including a binder layer containing a conductive microcapsule having a size of several hundred nanometers to several micrometers. The conductive microcapsule includes a liquid metal.

The liquid metal may include gallium (Ga) or a gallium-based alloy.

The gallium-based alloy may be at least one selected from the group consisting of a Ga—In alloy, a Ga—In—Sn alloy, and a Ga—In—Sn—Zn alloy.

The binder layer may include a low-temperature adhesive material having a self-healing ability.

The low-temperature adhesive material may include gelatin.

Another embodiment is a display device including: a display panel including a pad electrode; a flexible substrate including a wiring electrode; and an anisotropic conductive film which is interposed between the display panel and the flexible substrate and electrically connects the pad electrode and the wiring electrode. The anisotropic conductive film includes a binder layer containing a conductive microcapsule having a size of several hundred nanometers to several micrometers. The conductive microcapsule includes a liquid metal.

The liquid metal may include gallium (Ga) or a gallium-based alloy.

The gallium-based alloy may be at least one selected from the group consisting of a Ga—In alloy, a Ga—In—Sn alloy, and a Ga—In—Sn—Zn alloy.

The binder layer may include a low-temperature adhesive material having a self-healing ability.

The low-temperature adhesive material may be a hydrogel including gelatin.

Further another embodiment is a method for manufacturing an anisotropic conductive film. The method includes: manufacturing a conductive microcapsule having a diameter of several hundred nanometers to several micrometers by performing an ultrasonic treatment on a liquid metal; manufacturing a mixed solution by mixing the conductive microcapsule with a low-temperature adhesive material. In one embodiment, the adhesive material has a self-healing ability; and spin-coating the mixed solution at a constant speed and curing onto either a flexible substrate, a display panel, or in one embodiment, both of them.

The mixed solution may be manufactured at a temperature between 100° C. to 200° C.

A curing temperature of the mixed solution may be between 4° C. to 20° C.

Yet another embodiment is an electrode bonding method includes coating an anisotropic conductive film between a display panel including a pad electrode and a flexible substrate including a wiring electrode at a temperature of 30° C. to 50° C.

According to the embodiments of the present disclosure, since a microencapsulated liquid metal serves as a conductive ball, conductivity can be formed only by applying a certain pressure. Therefore, since the anisotropic conductive film according to the present disclosure has a vertical conductivity even at a low temperature compared to a conventional anisotropic conductive film, a wiring bonding process can be performed even at a low temperature.

Also, since the anisotropic conductive film according to the present disclosure has excellent stretchability, it can be used for a flexible printed circuit board.

DETAILED DESCRIPTION

Figure 1:
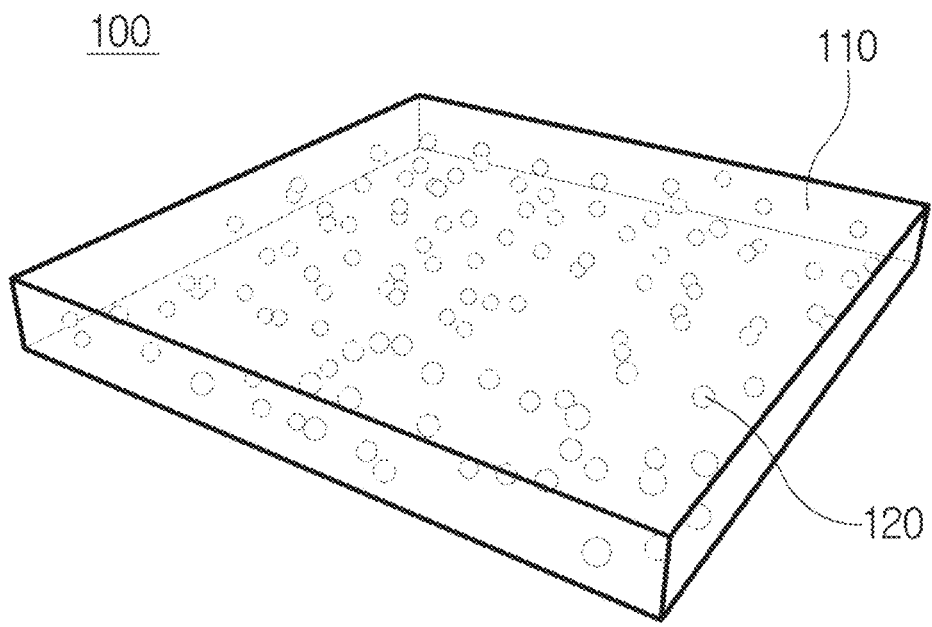
FIG. 1 is a perspective view for describing an anisotropic conductive film according to an embodiment of the present disclosure.

Hereinafter, embodiments of the present disclosure will be described with reference to the accompanying drawings. In this specification, when it is mentioned that a component (or region, layer, portion) "is on," "is connected to," or "is combined with" another component, terms "is on," "connected to," or "combined with" mean that a component may be directly connected to/combined with another component or mean that a third component may be disposed between them.

The same reference numerals correspond to the same components. Also, in the drawings, the thicknesses, ratios, and dimensions of the components are exaggerated for effective description of the technical details. A term "and/or" includes all of one or more combinations that related configurations can define.

While terms such as the first and the second, etc., can be used to describe various components, the components are not limited by the terms mentioned above. The terms are used only for distinguishing between one component and other components. For example, the first component may be designated as the second component without departing from the scope of rights of the disclosure. Similarly, the second component may be designated as the first component. The term of "and/or" includes a combination or one of a plurality of related items mentioned.

Terms such as "below," "lower," "above," "upper" and the like are used to describe the relationships between the components shown in the drawings. These terms have relative concepts and are described based on directions indicated in the drawings.

Terms used in the present specification are provided for description of only specific embodiments of the present disclosure, and not intended to be limiting. An expression of a singular form includes the expression of plural form thereof unless otherwise explicitly mentioned in the context. In the present specification, it should be understood that the term "include" or "comprise" and the like is intended to specify characteristics, numbers, steps, operations, components, parts or any combination thereof which are mentioned in the specification, and intended not to previously exclude the possibility of existence or addition of at least one another characteristics, numbers, steps, operations, components, parts or any combination thereof.

Figure 2:
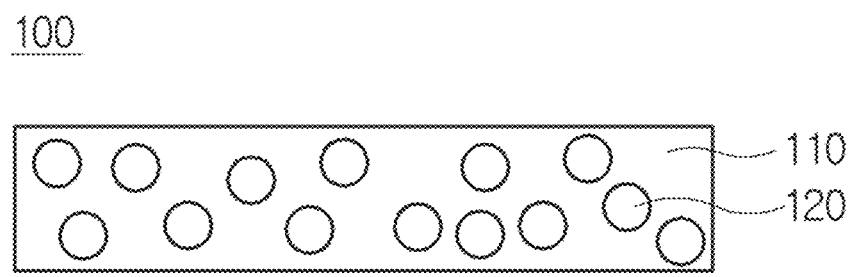
FIG. 2 is a cross-sectional view for schematically describing the anisotropic conductive film according to the embodiment of the present disclosure.

FIG. 1 is a perspective view for describing an anisotropic conductive film according to an embodiment of the present disclosure. FIG. 2 is a cross-sectional view for schematically describing the anisotropic conductive film according to the embodiment of the present disclosure.

Referring to FIGS. 1 and 2, the anisotropic conductive film 100 according to the embodiment of the present disclosure is provided in the form that conductive microcapsules 120 having a size of several hundred nanometers to several micrometers are dispersed in a binder layer 110. For example, the size of the conductive microcapsules corresponds to 100 nanometers to 999 micrometers. The conductive microcapsule 120 serves as a conductive ball which performs an electrical connection. The conductive microcapsules 120 may be irregularly or regularly arranged within the binder layer 110. For example, when the conductive microcapsules 120 are regularly arranged within the binder layer 110, the conductive microcapsules 120 are arranged at regular intervals along first and second directions which are orthogonal to each other in a planar manner, thereby forming a plurality of rows and columns.

In addition, the conductive microcapsules 120 may be distributed at different densities according to the thickness direction (height direction) of the binder layer 110. For example, the conductive microcapsules 120 may be uniformly or relatively uniformly dispersed in the lower portion of the binder layer 110, and the conductive microcapsules 120 may be dispersed at a low density in the upper portion of the binder layer 110.

The volume occupied by the conductive microcapsules 120 in the anisotropic conductive film 100 may be 5 vol % to less than 95 vol %, and it is obvious that the content of the conductive microcapsules may be appropriately changed according to the conditions of electrode bonding.

The conductive microcapsule 120 includes a liquid metal. The liquid metal may include gallium (Ga) or a gallium-based alloy. The gallium-based alloy may be at least one selected from the group consisting of a Ga—In alloy, a Ga—In—Sn alloy, and a Ga—In—Sn—Zn alloy. The Ga—In alloy may be Eutectic GaIn (EGaIn). Similarly, the Ga—In—Sn alloy is Eutectic GaInSn (EGaInSn). The liquid metal may be in a liquid state at room temperature. For example, since the Ga—In alloy has a melting point of about 15.3° C., the Ga—In alloy is present in a liquid state at a temperature higher than the melting point.

The binder layer 110 may have electrical insulating properties, flexibility greater than a certain value, and certain bonding properties. The binder layer 110 may include a low-temperature adhesive material. In one embodiment, the binder layer has a self-healing ability, and the low-temperature adhesive material may be a hydrogel including gelatin.

The hydrogel has a structure that contains a significant amount of water in a three-dimensional network, and is composed of hydrophilic chains. The network structure of the hydrogel is formed by physical bonds (hydrophobic interaction, Van der Waals force, hydrogen bonding, ionic interaction, or covalent bond). Depending on materials, the hydrogel may include a natural hydrogel (collagen, fibrin, gelatin, alginate, chitosan) and synthetic hydrogel [polyethylene glyocol (PEG), polyvinyl alcohol (PVA), polyhydroxymethacrylate (polyHEMA), silicone hydrogels, and polyacrylamide].

The self-healing ability of the hydrogel results from the reversibility of cross-linking and is performed through non-covalent cross-linking or dynamic covalent cross-linking. Non-covalent interactions within the self-healing hydrogel include ionic interactions, hydrogen bonding, hydrophobic interactions, and caged guest-host interactions.

The binder layer 110 may further include a thermosetting resin or a thermoplastic resin necessary or may further include at least one additive such as a catalyst and a hardener.

Hereinafter, a display device 500 in which a display panel and a flexible substrate are electrically connected by using the anisotropic conductive film including the liquid metal will be described.

Figure 3:
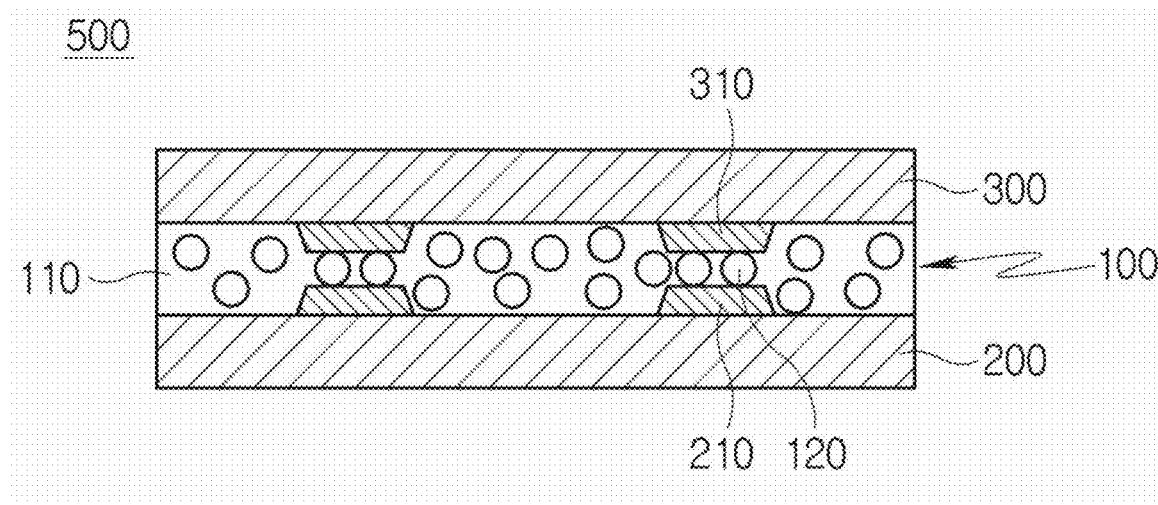
FIG. 3 is a view for describing a display device using the anisotropic conductive film according to the embodiments of the present disclosure and is a cross-sectional view corresponding to a pad area of a display panel.

FIG. 3 is a view for describing the display device using the anisotropic conductive film according to the embodiments of the present disclosure and is a cross-sectional view corresponding to a pad area of the display panel.

Referring to FIG. 3, the display device 500 includes a display panel 200 including a pad electrode 210, a flexible substrate 300 including a wiring electrode, and the anisotropic conductive film 100 which is interposed between the display panel 200 and the flexible substrate 300 and electrically connects the display panel 200 and the flexible substrate 300. The anisotropic conductive film 100 includes the binder layer 110 containing the conductive microcapsules 120 having a size of several hundred nanometers to several micrometers, and the conductive microcapsule 120 includes the liquid metal.

The display panel 200 and the flexible substrate 300 may be disposed such that the pad electrode 210 and the wiring electrode 310 face each other and vertically coincide with each other.

In the embodiment, the display panel 200 may include a display area and a non-display area, and pixels may be disposed in the display area. Also, the pad electrode 210 may be disposed in the pad area of the non-display area. The display device 500 may be a flexible organic light emitting diode display, but is not limited thereto.

The flexible substrate 300 may include a driving integrated circuit for driving the display panel 200.

Each of the pad electrode 210 and the wiring electrode 310 may include a metallic material having excellent electrical conductivity. For example, each of second metallic materials may include at least one selected from gold, chromium, silver, molybdenum, aluminum, copper, titanium, and alloys thereof.

The anisotropic conductive film 100 may be attached between the display panel 200 and the flexible substrate 300 and may electrically connect the pad electrode 210 and the wiring electrode 310. Since the anisotropic conductive film 100 has been fully described above, the detailed description thereof will be omitted.

Hereinafter, a method for manufacturing the display device using the anisotropic conductive film according to the embodiments of the present disclosure will be described.

Figure 10:
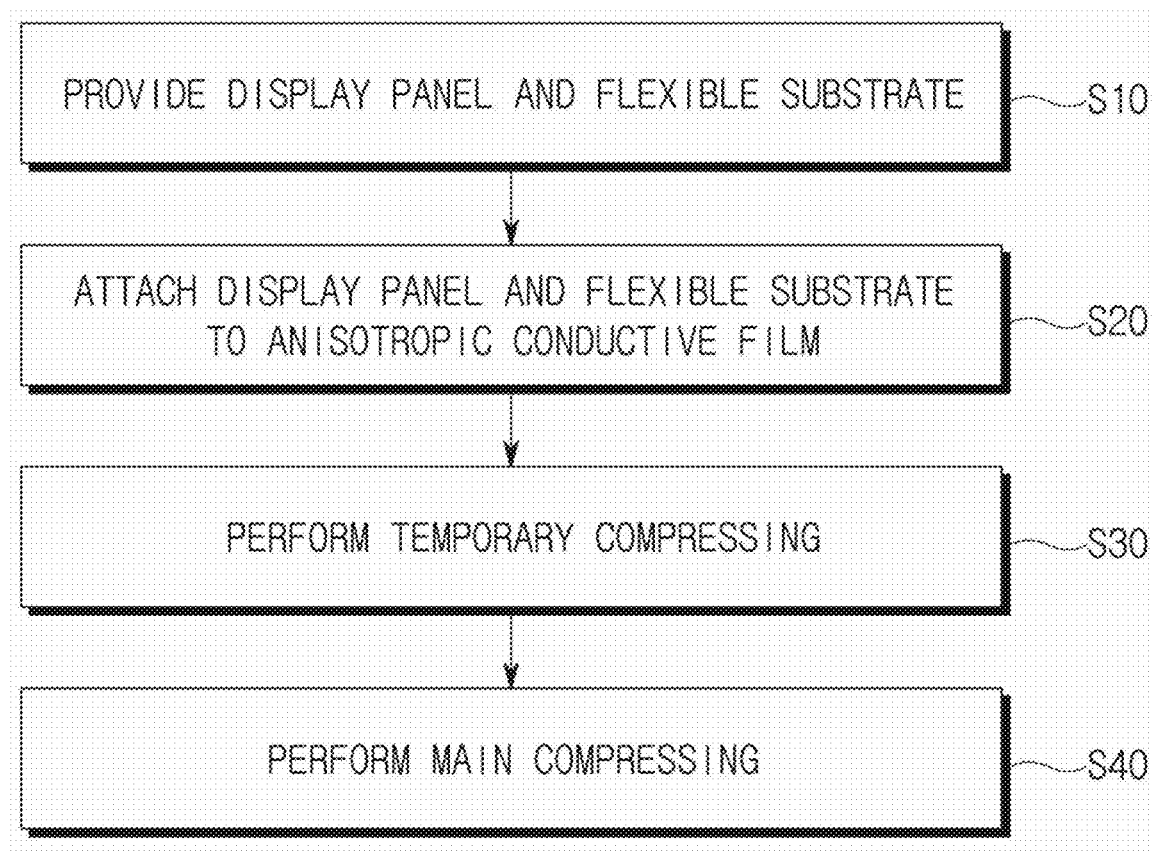
FIG. 10 is a flowchart for describing the method for manufacturing the display device using the anisotropic conductive film according to the embodiments of the present disclosure.

FIG. 10 is a flowchart for describing the method for manufacturing the display device using the anisotropic conductive film according to the embodiments of the present disclosure.

Referring to FIG. 10, the method for manufacturing the display panel 200 using the anisotropic conductive film 100 includes providing the display panel and the flexible substrate, step S10, then attaching the display panel and the flexible substrate to the anisotropic conductive film in step S20. Then, compression is performed in two steps, a temporary compression, step S30, followed by a main compression, step S40.

First, the display panel 200 including the pad electrode 210 and the flexible substrate 300 including the wiring electrode 310 may be provided, S10. The display panel 200 and the flexible substrate 300 may be manufactured through a semiconductor process using photolithography or the like, a plurality of times, and the detailed description thereof will be omitted.

The anisotropic conductive film 100 is disposed between the display panel 200 and the flexible substrate 300, and the flexible substrate 300 and display panel 200 may be attached to the top and bottom surfaces of the anisotropic conductive film 100, respectively, S20. Here, the display panel 200 and the flexible substrate 300 may be disposed such that the pad electrode 210 and the wiring electrode 310 face each other and vertically coincide with each other.

The flexible substrate 300 may be temporarily compressed on the anisotropic conductive film 100 to which the display panel 200 and the flexible substrate 300 have been attached, S30. The temporary compressing of the flexible substrate 300 may be performed at a temperature of 30° C. to 70° C.

The binder layer 110 is cured through the performing the main compressing, S40. Between the pad electrode 210 and the wiring electrode 310 which vertically face each other, the conductive microcapsules 120 maintain the contact with the electrodes 210 and 310, and thus, electrically connects them.

Hereinafter, a method for manufacturing the anisotropic conductive film including the liquid metal will be described.

In the method for manufacturing the anisotropic conductive film according to the embodiments of the present disclosure, first, the conductive microcapsules having a diameter of several hundred nanometers to several micrometers are manufactured by performing an ultrasonic treatment on the liquid metal. This is one technique for creating the conductive microcapsules, but other techniques can be used. The formation of the conductive microencapsulation of the liquid metal, the diameter of the capsule can be controlled according to the ultrasonic treatment time and/or intensity, and the diameter of the capsule may be preferably 100 nm to 100 um.

Next, a mixed solution is manufactured by mixing the manufactured conductive microcapsules with a low-temperature adhesive material having in at least one embodiment, a self-healing ability. The low-temperature adhesive material can be provided by the foregoing description. The mixed solution may be manufactured at a temperature of 100° C. to 200° C. Here, the volume of the liquid metal in the total solution volume may be 5 vol % to 95 vol %.

Finally, when the manufactured mixed solution is spin coated at a constant speed onto the flexible substrate 300 in one embodiment. In another embodiment, it is spin coated onto the display panel 200. In yet another embodiment, layer can be spin coated onto each of them. The anisotropic conductive film is then cured, completing the manufacture.

The thickness of the anisotropic conductive film may vary according to the spin speed of the spin coating. Then, the mixed solution may be cured at a constant curing temperature and for a certain curing period of time, and then may be formed in the form of a gel. The curing temperature may be 4° C. to 20° C., and the curing period of time may be adjusted within 2 to 24 hours.

The anisotropic conductive film can be applied by different techniques besides spin-coating; this is one acceptable method of applying it.

When wirings of different members are connected by using the anisotropic conductive film according to the embodiments of the present disclosure, the wiring process work is possible even at a temperature of 30° C. to 50° C. Accordingly, the wiring connection is possible in the flexible PCB in which a conventional wiring process technology having a high bonding process temperature is impossible. In addition, the anisotropic conductive film can be widely used not only in flexible PCB-based technologies but also in various flexible electronic devices that receive complex circuits.

EXPERIMENTAL EXAMPLE 1

The conductive microcapsules in a range of 1 um to 10 um are manufactured by performing the ultrasonic treatment on the liquid metal having a composition of EGaIn, 75 wt % of Ga, and 25 wt % of In.

Then, a mixed solution is manufactured by mixing the manufactured liquid metal with gelatin at a temperature of about 150° C. for 10 minutes (the volume ratio of Gelatin is 10 vol %).

Figure 4:
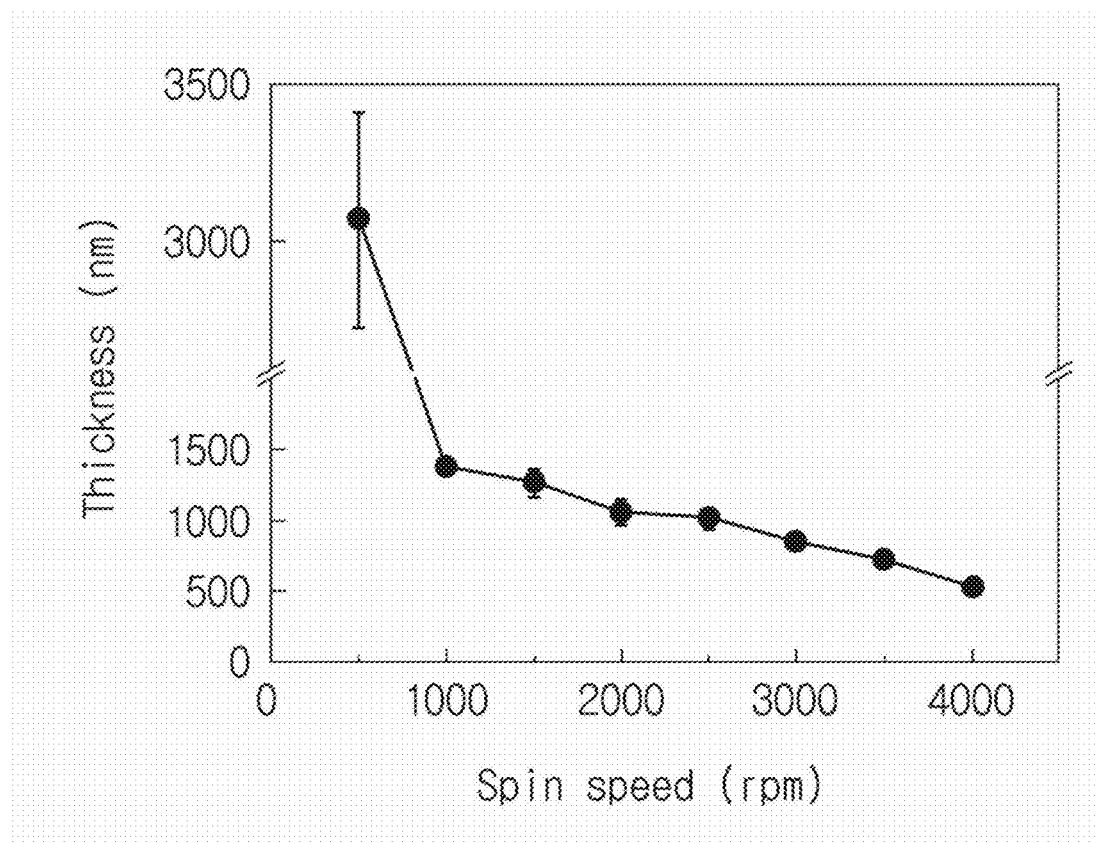
FIG. 4 is a graph showing a change in thickness of the anisotropic conductive film according to a spin speed.
Figure 5:
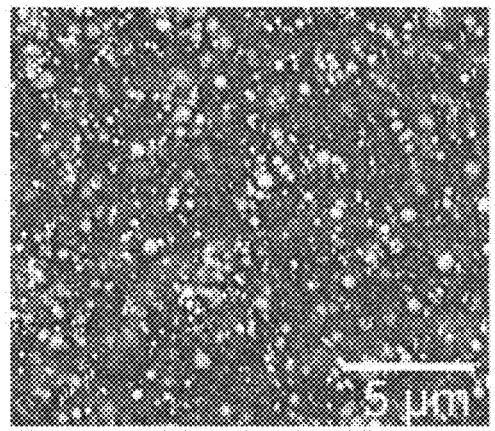
FIG. 5 shows an SEM photograph of the anisotropic conductive film.

The ACF is manufactured by spin-coating the manufactured mixed solution, and it can be found in FIG. 4 that the thickness of the ACF varies depending on the spin speed. After the manufactured mixed solution is spin coated at a speed of 2000 rpm and is cured for 15 hours, the ACF is finally manufactured. A corresponding SEM photograph is shown in FIG. 5.

Figure 6:
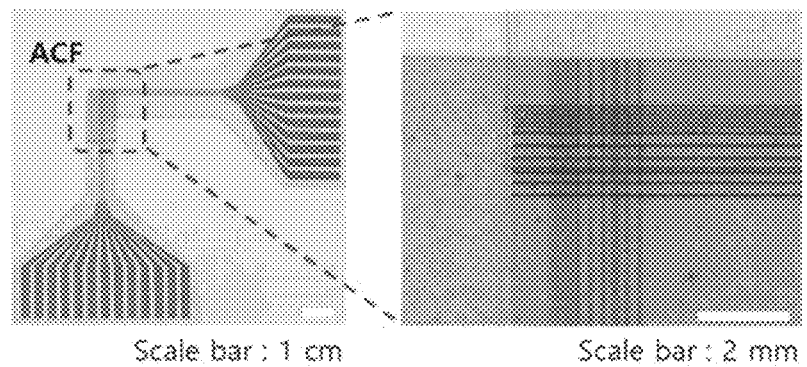
FIG. 6 is a view showing bonding between electrodes by the anisotropic conductive film.

It was confirmed that when the manufactured ACF was coated on a portion where wiring bonding is performed and when a pressure of about 0.1 MPa to 0.5 MPa was applied to the portion at a temperature of 40° C., conductivity anisotropically occurred. Also, it was confirmed that when five minutes elapsed at room temperature of 25° C. after the bonding, the bonding between the electrodes was formed by the ACF as shown in FIG. 6.

EXPERIMENTAL EXAMPLE 2

Figure 7:
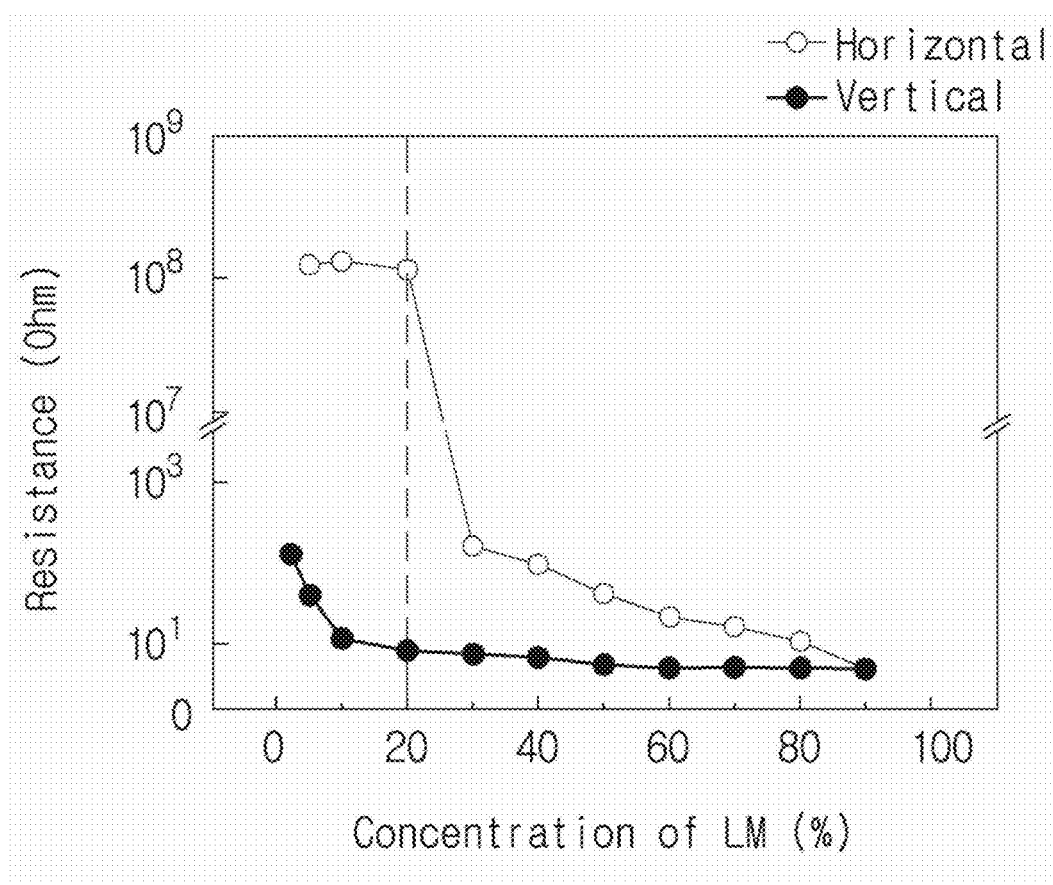
FIG. 7 is a graph showing a change in conductivity according to a volume ratio of a liquid metal.

In experimental example 1, the conductivity of the ACF according to the volume ratio of the liquid metal is measured, and it was confirmed that the conductivity varied according to the volume ratio of the liquid metal as shown in FIG. 7.

EXPERIMENTAL EXAMPLE 3

Figure 8:
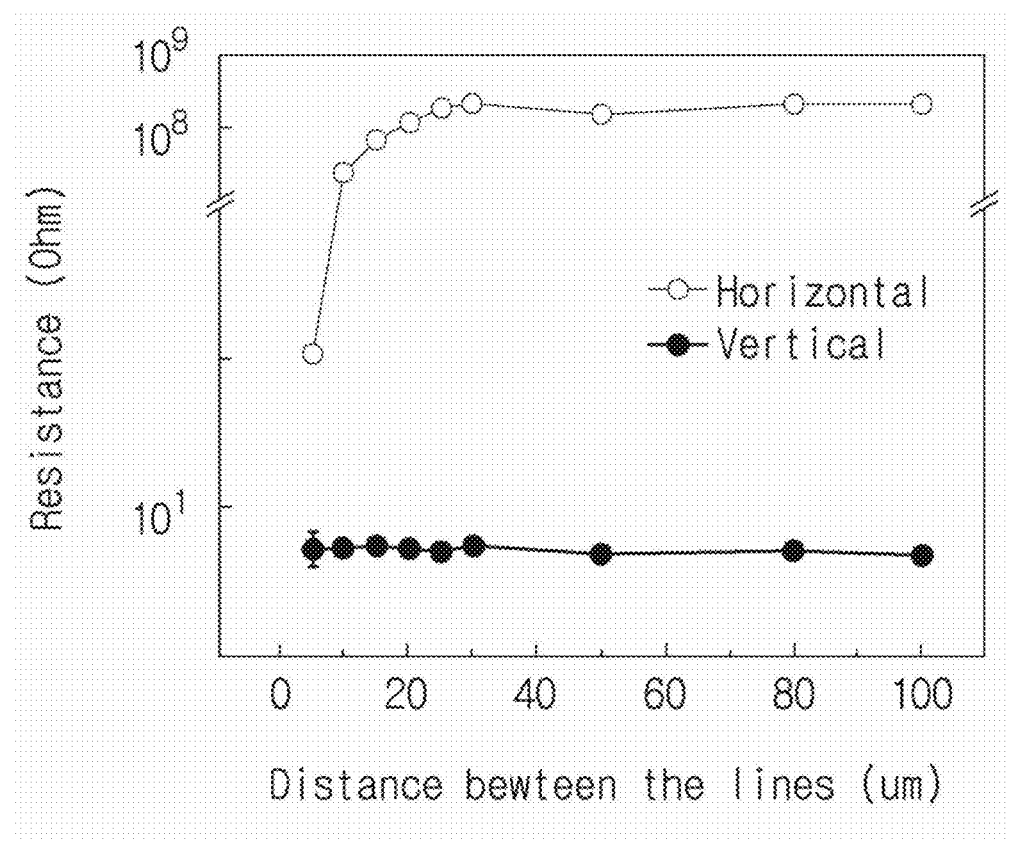
FIG. 8 is a graph showing a result of measuring conductivity according to electrode spacing.

By using the ACF manufactured in the experimental example 1, the anisotropic conductivity of the electrode having a fine spacing of 10 μm or less was measured. As a result, it was confirmed that the ACF had excellent conductivity as shown in FIG. 8.

EXPERIMENTAL EXAMPLE 4

Figure 9A:
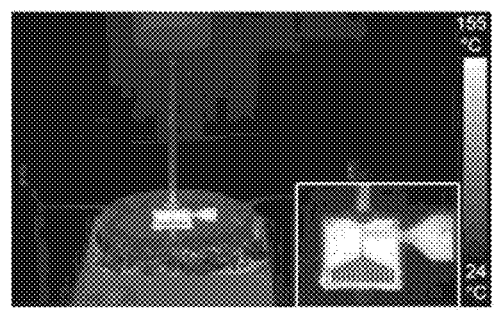
FIG. 9A is a view showing a result of measuring thermal stability under specific conditions.
Figure 9B:
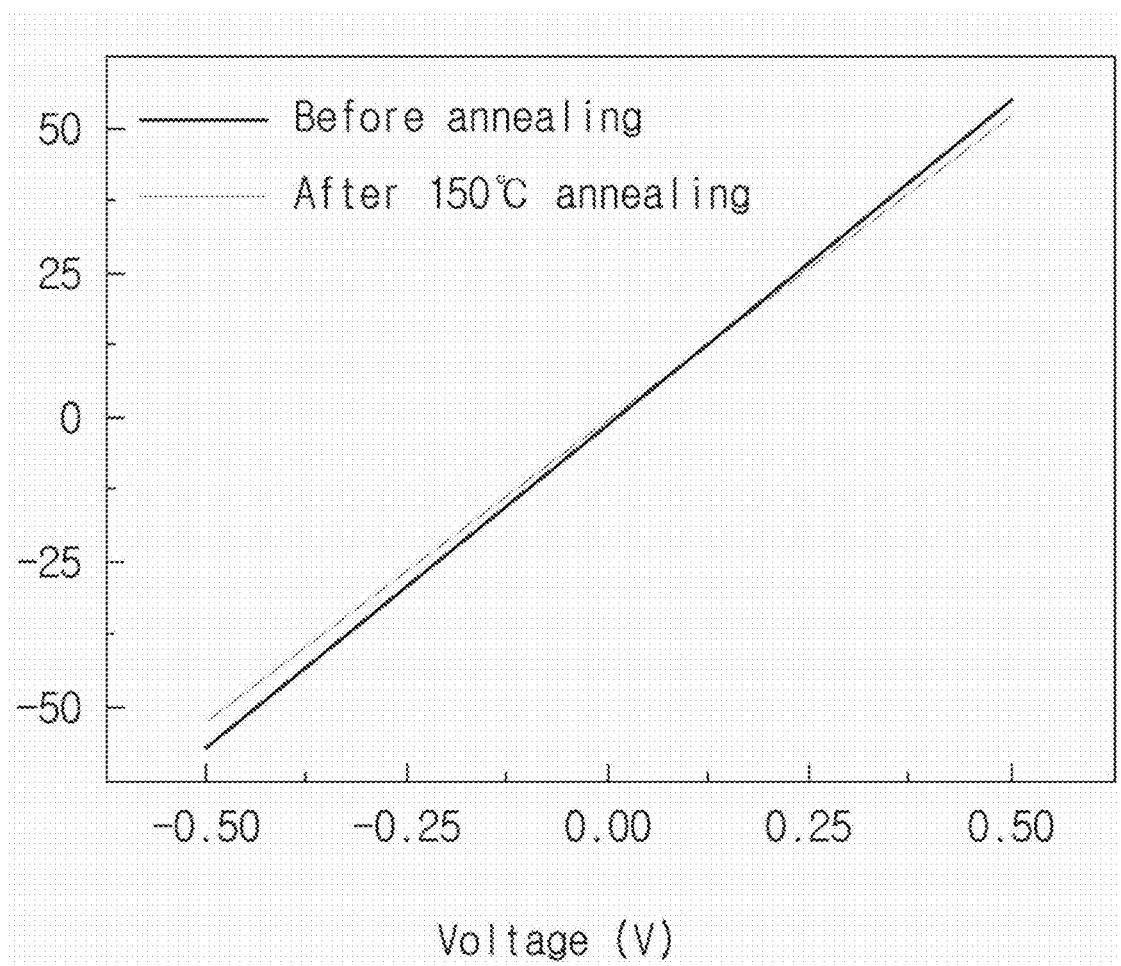
FIG. 9B is a view showing a result of confirming a process property of a subsequent process.

By using the ACF manufactured in experimental example 1, thermal stability is measured at a temperature of 150° C. as shown in FIG. 9A. As a result, the process property of the subsequent process shown in FIG. 9B was confirmed.

It can be understood by those skilled in the art that the embodiments can be embodied in other specific forms without departing from its spirit or essential characteristics. Therefore, the foregoing embodiments and advantages are merely exemplary and are not to be construed as limiting the present disclosure. It can be understood by those skilled in the art that the embodiments can be embodied in other specific forms without departing from its spirit or essential characteristics. Therefore, the foregoing embodiments and advantages are merely exemplary and are not to be construed as limiting the present disclosure. The scopes of the embodiments are described by the scopes of the following claims rather than by the foregoing description. All modification, alternatives, and variations derived from the scope and the meaning of the scope of the claims and equivalents of the claims should be construed as being included in the scopes of the embodiments.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a display panel comprising display area pixels that are disposed and a non-display area;
   a plurality of pad electrodes disposed in the non-display area, and directly connected to the display panel;
   a flexible substrate comprising a plurality of wiring electrodes and a driving integrated circuit; and
   an anisotropic conductive film which is interposed between the display panel and the flexible substrate and electrically connects the pad electrode and the wiring electrode,
   wherein:
   the plurality of pad electrodes are separated from each other and the plurality of wiring electrodes are separated from each other; and
   the entire region of the pad electrodes overlaps the entire region of the wiring electrodes in the thickness direction.

2. The display device of claim 1, wherein:
   the anisotropic conductive film comprises a binder layer containing a plurality of conductive microcapsules; and the conductive microcapsules comprise a liquid metal consisting of gallium (Ga) or at least one gallium-based alloy.

3. The display device of claim 2, wherein the liquid metal consists of at least one gallium-based alloy selected from the group consisting of a Ga—In alloy, a Ga—In—Sn alloy, and a Ga—In—Sn—Zn alloy.

4. The display device of claim 2, wherein the binder layer further comprises an adhesive material having a self-healing ability.

5. The display device of claim 4, wherein the adhesive material is a hydrogel comprising gelatin.

6. The display device of claim 2, wherein the diameter of the microcapsules is between 100 nm and 100 μm.

7. The anisotropic conductive film of claim 2, wherein each microcapsule has a diameter between 100 nm and 900 μm.

8. The display device of claim 2, wherein the conductive microcapsules are regularly arranged within the binder layer at regular intervals along first and second directions which are orthogonal to each other in a planar manner.

9. The display device of claim 8, wherein the conductive microcapsules are regularly arranged at the regular intervals in rows and columns along the first and second directions.

10. The display device of claim 2, wherein the conductive microcapsules are distributed at different densities along a thickness direction of the binder layer.

11. The display device of claim 2, wherein the conductive microcapsules are uniformly dispersed with a first density at a lower portion of the binder layer adjacent to the display panel, and the conductive microcapsules are dispersed with a second density at an upper portion of the binder layer adjacent to the flexible substrate, such that the second density is less than the first density.

* * * * *